(12) United States Patent
Kommera et al.

(10) Patent No.: US 8,828,784 B2
(45) Date of Patent: Sep. 9, 2014

(54) RESISTANCE COMPONENT EXTRACTION FOR BACK CONTACT BACK JUNCTION SOLAR CELLS

(71) Applicant: Solexel, Inc., Milpitas, CA (US)

(72) Inventors: Swaroop Kommera, San Jose, CA (US); Pawan Kapur, Burlingame, CA (US); Mehrdad M. Moslehi, Los Altos, CA (US)

(73) Assignee: Solexel, Inc., Milpitas, CA (US)

( * ) Notice: Subject to any disclaimer, the term of this patent is extended or adjusted under 35 U.S.C. 154(b) by 0 days.

(21) Appl. No.: 13/868,987

(22) Filed: Apr. 23, 2013

(65) Prior Publication Data

US 2014/0147944 A1 May 29, 2014

Related U.S. Application Data

(60) Provisional application No. 61/637,126, filed on Apr. 23, 2012.

(51) Int. Cl.
*H01L 21/00* (2006.01)

(52) U.S. Cl.
USPC ............. 438/87; 438/59; 438/62; 438/72; 438/93; 438/97

(58) Field of Classification Search
None
See application file for complete search history.

(56) References Cited

U.S. PATENT DOCUMENTS

2012/0103408 A1* 5/2012 Moslehi et al. ............ 136/256

* cited by examiner

*Primary Examiner* — Kyoung Lee

(57) ABSTRACT

Methods and structures for extracting at least one electric parametric value from a back contact solar cell having dual level metallization are provided.

13 Claims, 15 Drawing Sheets

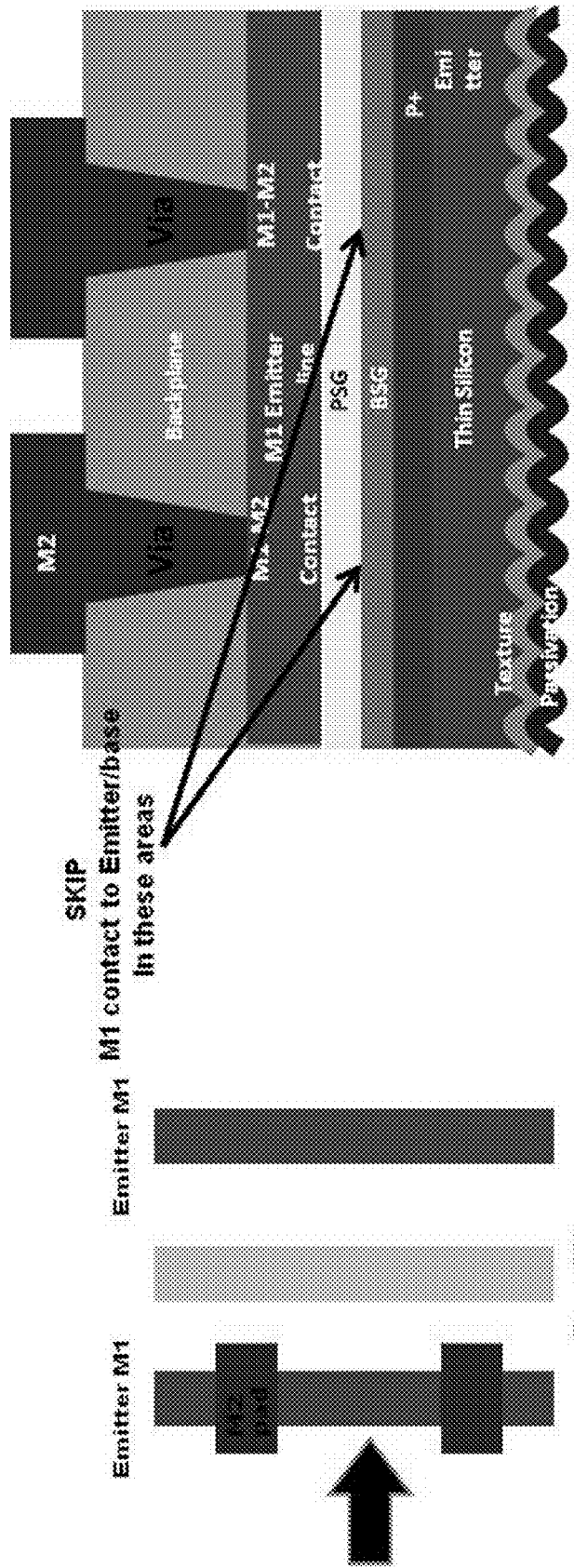

RESISTANCE COMPONENT EXTRACTION FOR BACK CONTACT BACK JUNCTION SOLAR CELLS

CROSS-REFERENCE TO RELATED APPLICATIONS

This application claims priority to U.S. Provisional Patent Application Ser. No. 61/637,126 filed Apr. 23, 2012, which is hereby incorporated by reference in its entirety.

FIELD

The present disclosure relates in general to the fields of semiconductor processing. More particularly, the present disclosure relates to the methods and structures for electrical parametric value extraction from back contact solar cells.

BACKGROUND

Generally, crystalline semiconductor solar cells may be categorized as front contacted solar cells (often formed of mono and multi-crystalline silicon) or back contacted solar cells (often formed of mono-crystalline silicon). While the series resistance of conventional front contact cells tends to be dominated by the contact resistances from metal paste fire processing used to form front contact metallization, the series resistance for a back contact cell has additional components which come into play. In addition, back contact solar cell extraction is more involved/complex as compared to front contact solar cells. This is particularly the case for thinner absorber (for example less than approximately 100 um thick) back contacted solar cells where the base diffusion resistance of the silicon is also important.

Typical back contact/back junction solar components may include, for example: 1) base diffusion resistance; 2) emitter diffusion resistance; 3) base contact resistance; 4) emitter contact resistance, and 5) metal resistance. Further, a dual or multi-level metallization scheme (such as that as depicted in FIG. 1), may also comprise metal 1 (M1) to metal 2 (M2) contact resistances for both emitter and base lines, and metal 2 resistance (metal 1 and metal 2 refer to the first and the second level metallization patterns, respectively). Currently, extraction and measurement of back contacted cells, and particularly thin back contacted cells with dual level metallization, remains challenging. However, as solar cells develop, additional resistance components resulting from the addition of dual level metallization along with an increase in base diffusion resistance due to thinner films makes back contacted solar cells extraction imperative.

BRIEF SUMMARY

Therefore, a need has arisen for back contact solar cell electrical parameter testing methods and structures. In accordance with the disclosed subject matter, methods and structures for extracting at least one electric parametric value from a back contact solar cell having dual level metallization are provided which substantially eliminate or reduce the challenges and cost and fabrication disadvantages associated with previously developed back contact solar cell electrical parameter testing methods and structures.

According to one aspect of the disclosed subject matter, methods for testing electrical parameters on a back contact solar cell. In one embodiment, a first layer of electrically conductive metal having an interdigitated pattern of base electrodes and emitter electrodes is formed on the backside surface of a crystalline semiconductor solar cell substrate. An electrically insulating layer is formed on the first layer of electrically conductive metal which provides electrical isolation between the first layer of electrically conductive metal and a second layer of electrically conductive metal. Vias are formed in the electrically insulating layer which provide access to the first layer of electrically conductive metal. A second electrically conductive metallization layer is formed on the electrically insulating layer and contacts the first electrically conductive metal layer through the vias. An electrical parametric value is extracted from the back contact crystalline semiconductor solar cell by probing said the electrically conductive metallization layer with an electrical current or voltage.

These and other aspects of the disclosed subject matter, as well as additional novel features, will be apparent from the description provided herein. The intent of this summary is not to be a comprehensive description of the claimed subject matter, but rather to provide a short overview of some of the subject matter's functionality. Other systems, methods, features and advantages here provided will become apparent to one with skill in the art upon examination of the following FIGUREs and detailed description. It is intended that all such additional systems, methods, features and advantages that are included within this description, be within the scope of any claims.

BRIEF DESCRIPTION OF THE DRAWINGS

The features, nature, and advantages of the disclosed subject matter may become more apparent from the detailed description set forth below when taken in conjunction with the drawings in which like reference numerals indicate like features and wherein:

FIG. 5A is a diagram of a top view of a M1 and M2 test structure layout;

FIG. 5B is a cross-sectional diagram of the solar cell structure of FIG. 5A;

DETAILED DESCRIPTION

Figure 1:
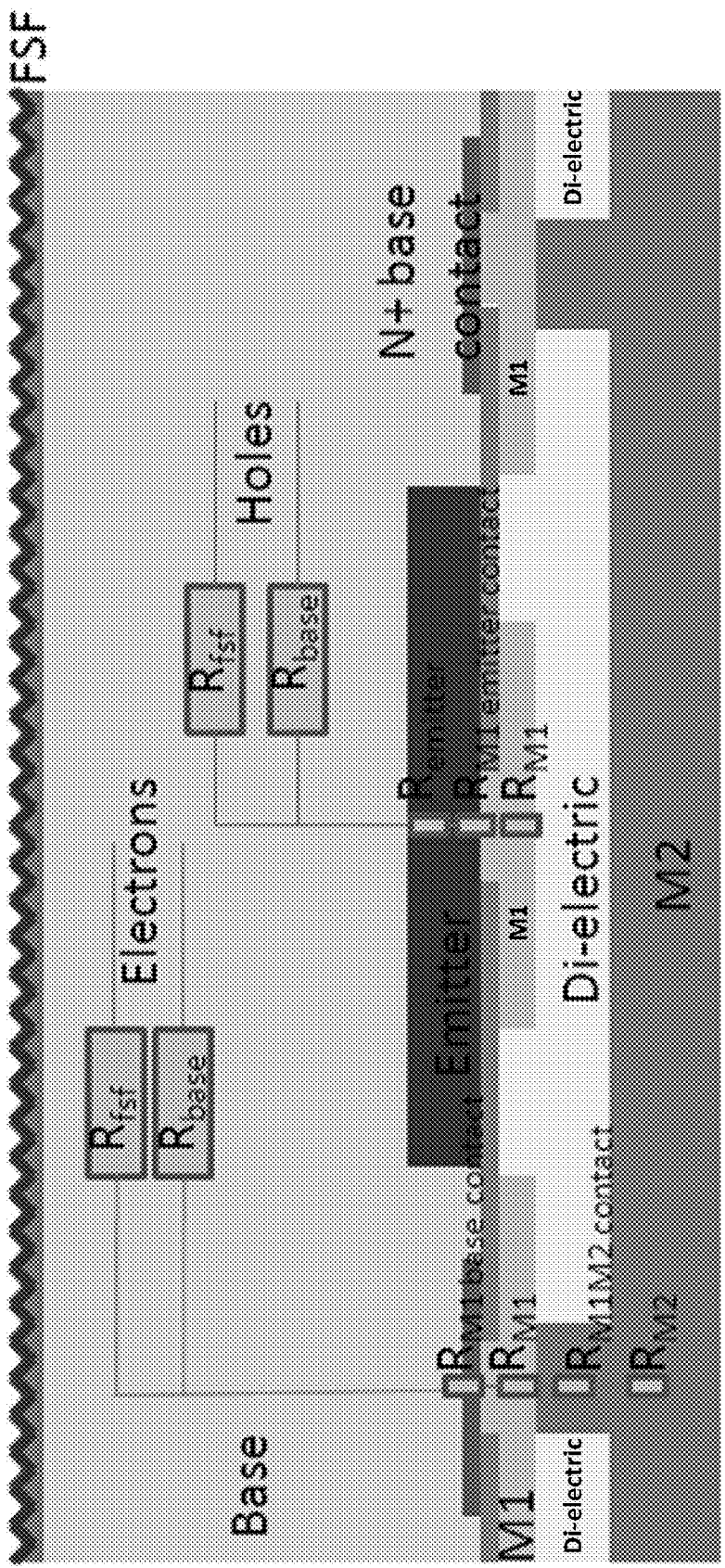
FIG. 1 is a cross-sectional diagram of a multi level metallization back contact solar cell showing series resistance components.

The following description is not to be taken in a limiting sense, but is made for the purpose of describing the general principles of the present disclosure. The scope of the present disclosure should be determined with reference to the claims. Exemplary embodiments of the present disclosure are illustrated in the drawings, like numbers being used to refer to like and corresponding parts of the various drawings.

The exemplary process flows, materials, and dimensions disclosed are provided both as detailed descriptions for specific embodiments and to be used generally when forming and designing solar cells in accordance with the disclosed subject matter. One having skill in the art will recognize that aspects of the described process flows and structures may be combined and/or added or deleted in numerous and various ways to form solar cells in accordance with the disclosed subject matter.

And although the present disclosure is described with reference to specific embodiments, such as back contact solar cells using monocrystalline silicon substrates having a thickness in the range of 10 to 200 microns and other described fabrication materials metallization layers, one skilled in the art could apply the principles discussed herein other fabrication materials including alternative semiconductor materials (such as gallium arsenide, germanium, multi-crystalline silicon, etc.), metallization layers comprising metallization stacks, technical areas, and/or embodiments without undue experimentation.

The disclosed subject matter provides structures and methods to independently extract components of series resistance (some or all) from a back contacted solar cell. In some instances, test structures utilize novel dual level metallization scheme deployed for a back contact/back junction solar cell which facilitates the extraction of various components. Series resistance is an important parameter determining cell efficiency as it directly impacts Fill factor of the solar cell. In some instances, the resistance test structures and methods provided may positioned alongside the solar cells on the same cell while being measured in parallel with the solar cell. Or, alternatively, the resistance test structures may run as an inline diagnostic in either a high volume production line at a regular frequency or in a development/testing environment to trouble shoot Fill factor. A key advantage of the disclosed test structures and methods is that the testing process flow may be identical to the solar cell fabrication process flow. (A difference may occur in the form of a slight modification in metallization patterning using two steps). Thus, the disclosed test structures and methods may be integrated alongside a solar cell on the same wafer or as an independent vehicle. Utilizing the solar cell fabrication process flow allows the test structures methods disclosed herein to capture the true series resistance components of the solar cell on a given process flow and process recipes. And while these structures and methods are described primarily with reference for back contact solar cells with multiple layers of metallization interconnects (M1 and M2 for example), they are also applicable for a single level metal back contact cells as well (particularly pertaining to the resistance components which are common between single and double level metallization).

Advantages of the disclosed testing structures and methods include, but are not limited to:

All of the components of the series resistance may be directly measured on a completed solar cell, thus obviating the need to use multiple substrates and test structures (may not take into account the various interactions);

The wafers utilizing the disclosed test structures may be processed concurrently with the product wafers allowing for measurements representing values under the same processing conditions as the product;

The testing structures may be reconfigurable to measure variations of the parameters across the wafers—thus, extracting not only spatial variations in Rseries, but also its breakdown into individual components across a solar cell (measurements which may be particularly useful in failure analysis during process development);

The testing structures may be incorporated into the product cells and the series resistance data extracted may be used to measure the health of the cell line.

Solar cells structures described herein comprise two metallization layers separated by a dielectric layer. The two metal layers may be connected using vias in the dielectric layer. The dielectric layer may be deposited using a myriad of deposition schemes including, but not limited to, screen printing, or may be formed using lamination of dielectric materials with binding resin. Vias may then be drilled, subsequent to the dielectric backplane deposition/lamination/attachment, using mechanical, chemical, or laser drilling techniques. Alternatively, the dielectric may be deposited in a pattern leaving via openings uncovered during deposition (or in the case of lamination the via holes may be predrilled prior to lamination).

By opening vias at selective locations and patterning the metal layers, structures may be designed to measure the components of the series resistance. FIG. 1 is a cross-sectional diagram of a multi level metallization back contact solar cell showing series resistance components (a base M2 line). As shown in FIG. 1, series resistance in a two level metal structure consists of the following components—resistance of second level metal line ($R_{M2}$), M1-M2 contact resistance ($R_{M1\text{-}M2\,contact}$), M1 line resistance ($R_{M1}$), M1—silicon contact ($R_{M1\text{-}base\,contact}$ or $R_{M1\text{-}emitter\,contact}$), base diffusion resistance ($R_{base}$), front surface field diffusion resistance ($R_{FSF}$), and emitter diffusion resistances ($R_{emitter}$).

The disclosed testing structures are applicable to multilevel metallization or conventional single metal level schemes. In some instances, and described fir the case of an epitaxial based solar cell, the process steps may be irrespective of the metallization layers. The testing structures and methods are described with detail herein as applied directly to the formation of high-efficiency back-contact, back-junction solar cells utilizing multi-layer backside metallization. As compared to front-contact solar cells, all back-junction, back-contact solar cells have all metallization (both base and emitter metallization and busbars) positioned on the backside of the cell and may eliminate sunlight shading due to metal runners on the front/sunnyside surface of the cell (optical shading losses of emitter metal fingers and busbars in the case of traditional front-contact solar cells). And while metallization (both the base and the emitter contacts) of the cells may be formed on the same side (opposite the sunnyside) to eliminate the optical shading losses, cell metallization complexity may be increased in some back contact designs as both the base and emitter electrodes have to be contacted on the same side. (However, in some instances same side base and emitter contacts may simplify solar cell interconnections at the module level).

In some instances, an interdigitated metallization scheme requiring high metal pattern fidelity may be used. And as metallization pattern geometries may be formed increasingly smaller to increase cell efficiencies, the required thickness of the metallization layer may also significantly increase—for example 30 to 60 microns for a high conductivity metallization layer, such as copper or aluminum, on solar cells with dimensions of 125 mm×125 mm to 156 mm×156 mm.

Further, to reduce required metallization thickness, cell metallization may be partitioned into two metal layers/levels and a backplane material (such as a dielectric or polymer sheet) may be formed between the two metallization layers to help reduce stress induced from the thicker higher-conductance second metallization level. In other words, the backplane material separates the two metallization layers and provides structural support to the solar cell substrate allowing for scaling to large area back-contact solar cells. Thus, each layer—first metallization layer (M1), backplane material, and second metallization layer (M2)—may be optimized separately for cost and performance. And in some dual—level metallization embodiments, the two metal levels are patterned orthogonally with to each other, with the second (last) metal level having far fewer and coarser fingers than the first (on-cell) metal level.

And although the following exemplary back junction back contact solar cell designs and manufacturing processes described herein utilize two levels of metallization (dual layer metallization) which are separated by an electrically insulating and mechanically supportive backplane layer, the disclosed subject matter may be applicable in any fabrication embodiment requiring testing structures and methods. In some instances any combination of the backplane and metallization layers may serve as permanent structural support/reinforcement and provide embedded high-conductivity (aluminum and/or copper) interconnects for a high-efficiency thin crystalline silicon solar cell without significantly compromising solar cell power or adding to solar cell manufacturing cost.

Figure 2A:
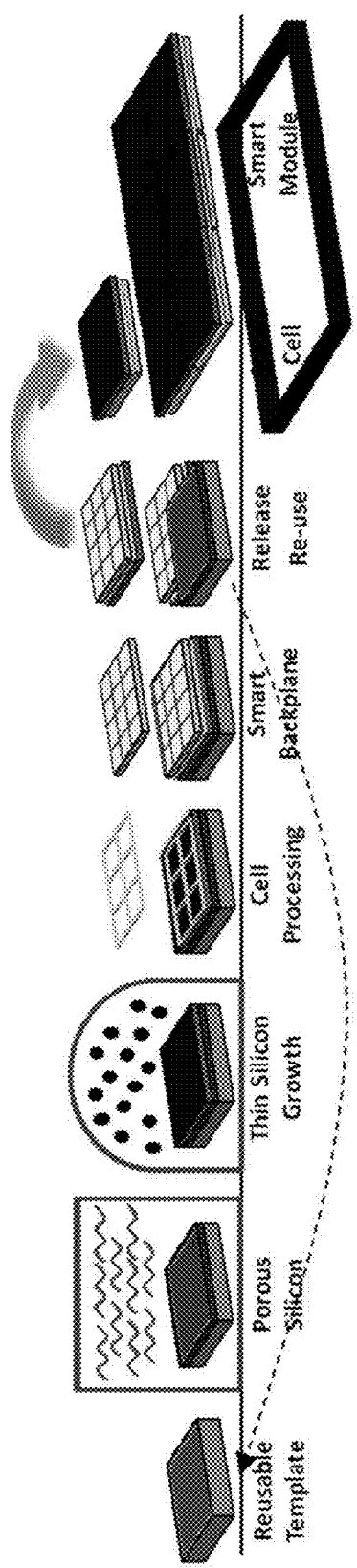
FIG. 2A is a general process flow for the formation of a back-contact back-junction solar cell.

In some instances, the testing structures and methods described herein may be applied to and integrated with current back-contact back-junction solar cell structures and fabrication processes. FIG. 2A is a general process flow for the formation of a back-contact back-junction solar cell which may utilize the disclosed testing structures and methods. Specifically, FIG. 2A is a general process flow highlighting key processing of a tested thin-crystalline-silicon solar cell manufacturing process using thin epitaxial silicon lift-off processing which substantially reduces silicon usage and eliminates traditional manufacturing steps to create low-cost, high-efficiency, back-junction/back-contact monocrystalline cells. The process flow of FIG. 2A shows the fabrication of solar cells having laminated backplanes for smart cell and smart module design formed using a reusable template and epitaxial silicon deposition on a release layer of porous silicon which may utilize and integrate testing structures and methods disclosed herein.

The process shown in FIG. 2A starts with a reusable silicon template, typically made of a p-type monocrystalline silicon wafer, onto which a thin sacrificial layer of porous silicon is formed (for example by an electrochemical etch process through a surface modification process in an HF/IPA wet chemistry in the presence of an electrical current). The starting material or reusable template may be a single crystalline silicon wafer, for example formed using crystal growth methods such as FZ, CZ, MCZ (Magnetic stabilized CZ), and may further comprise epitaxial layers grown over such silicon wafers. The semiconductor doping type may be either p or n and the wafer shape, while most commonly square shaped, may be any geometric or non-geometric shape such as quasi-square or round.

Upon formation of the sacrificial porous silicon layer, which serves both as a high-quality epitaxial seed layer as well as a subsequent separation/lift-off layer, a thin layer (for example a layer thickness in the range of a few microns up to about 70 microns, or a thickness less than approximately 50 microns) of in-situ-doped monocrystalline silicon is formed, also called epitaxial growth. The in-situ-doped monocrystalline silicon layer may be formed, for example, by atmospheric-pressure epitaxy using a chemical-vapor deposition or CVD process in ambient comprising a silicon gas such as trichlorosilane or TCS and hydrogen.

Prior to backplane lamination, the solar cell base and emitter contact metallization pattern is formed directly on the cell backside, for instance using a thin layer of screen printed or sputtered (PVD) or evaporated aluminum (or aluminum silicon alloy or Al/NiV/Sn stack) material layer. This first layer of metallization (herein referred to as M1) defines the solar cell contact metallization pattern, for example fine-pitch interdigitated back-contact (IBC) conductor fingers defining the base and emitter regions of the IBC cell. The M1 layer extracts the solar cell current and voltage and transfers the solar cell electrical power to the second level/layer of higher-conductivity solar cell metallization (herein referred to as M2) formed after M1.

After completion of a majority of solar cell processing steps, a very-low-cost dielectric backplane layer may be bonded to the thin epi layer for permanent cell support and reinforcement as well as to support the high-conductivity cell metallization of the solar cell. The backplane material may be made of a thin (for instance, a thickness in the range of approximately 50 to 250 microns and in some instances in the range of 50 to 150 microns), flexible, and electrically insulating polymeric material sheet such as an inexpensive prepreg material commonly used in printed circuit boards which meets cell process integration and reliability requirements. The mostly-processed back-contact, back-junction backplane-reinforced large-area (for instance, a solar cell area of at least 125 mm×125 mm, 156 mm×156 mm, or larger) solar cell is then separated and lifted off from the template along the mechanically-weakened sacrificial porous silicon layer (for example through a mechanical release MR process) while the template may be re-used many times to further minimize solar cell manufacturing cost. Final cell processing may then be performed on the solar cell sunny-side which is exposed after being released from the template. Sunny-side processing may include, for instance, completing frontside texturization and passivation and anti-reflection coating deposition process.

As described with reference to the flow outlined in FIG. 2A, after formation of the backplane (on or in and around M1 layer), subsequent detachment of the backplane-supported solar cell from the template along the mechanically weak sacrificial porous silicon layer, and completion of the frontside texture and passivation processes, a higher conductivity M2 layer is formed on the backplane. Via holes (in some instances up to hundreds or thousands of via holes) are drilled into the backplane (for example by laser drilling) and may have diameters in the range of approximately 50 up to 500 microns. These via holes land on pre-specified regions of M1 for subsequent electrical connections between the patterned M2 and M1 layers through conductive plugs formed in these via holes. Subsequently or in conjunction with the via holes filling and conductive plug formation, the patterned higher-conductivity metallization layer M2 is formed (for example by plasma sputtering, plating, evaporation, or a combination thereof—using an M2 material comprising aluminum, Al/NIV, Al/NiV/Sn, or copper). For an interdigitated back-contact (IBC) solar cell with fine-pitch IBC fingers on M1 (for instance, hundreds of fingers), the patterned M2 layer may be designed orthogonal to M1—in other words rectangular or tapered M2 fingers are essentially perpendicular to the M1 fingers. Because of this orthogonal transformation, the M2 layer may have far fewer IBC fingers than the M1 layer (for instance, by a factor of about 10 to 50 fewer M2 fingers). Hence, the M2 layer may be formed in a much coarser pattern with wider IBC fingers than the M1 layer. Solar cell busbars may be positioned on the M2 layer, and not on the M1 layer (in other words a busbarless M1 ), to eliminate electrical shading losses associated with on-cell busbars. As both the base and emitter interconnections and busbars may be positioned on the M2 layer on the solar cell backside backplane, electrical access is provided to both the base and emitter terminals of the solar cell on the backplane from the backside of the solar cell.

The backplane material formed between M1 and M2 may be a thin sheet of a polymeric material with sufficiently low coefficient of thermal expansion (CTE) to avoid causing excessive thermally induced stresses on the thin silicon layer. Moreover, the backplane material should meet process integration requirements for the backend cell fabrication processes, in particular chemical resistance during wet texturing of the cell frontside and thermal stability during the PECVD deposition of the frontside passivation and ARC layer. The electrically insulating backplane material should also meet the module-level lamination process and long-term reliability requirements. While various suitable polymeric (such as plastics, fluropolymers, prepregs, etc.) and suitable non-polymeric materials (such as glass, ceramics, etc.) may be used as the backplane material, backplane material choice depends on many considerations including, but not limited to, cost, ease of process integration, reliability, pliability, etc.

A suitable material choice for the backplane material is prepreg. Prepreg sheets are used as building blocks of printed circuit boards and may be made from combinations of resins and CTE-reducing fibers or particles. The backplane material may be an inexpensive, low-CTE (typically with CTE <10 ppm/° C., or with CTE <5 ppm/° C.), thin (for example 50 to 250 microns, and more particularly in the range of about 50 to 150 microns) prepreg sheet which is relatively chemically resistant to texturization chemicals and is thermally stable at temperatures up to at least 180° C. (or as high as at least 280° C.). The prepreg sheet may be attached to the solar cell backside while still on the template (before the cell lift off process) using a vacuum laminator. Upon applying heat and pressure, the thin prepreg sheet is permanently laminated or attached to the backside of the processed solar cell. Then, the lift-off release boundary is defined around the periphery of the solar cell (near the template edges), for example by using a pulsed laser scribing tool, and the backplane-laminated solar cell is then separated from the reusable template using a mechanical release or lift-off process. Subsequent process steps may include: (i) completion of the texture and passivation processes on the solar cell sunnyside, (ii) completion of the solar cell high conductivity metallization on the cell backside (which may comprise part of the solar cell backplane). The high-conductivity metallization M2 layer (for example comprising aluminum, copper, or silver) comprising both the emitter and base polarities is formed on the laminated solar cell backplane.

Figure 2B:
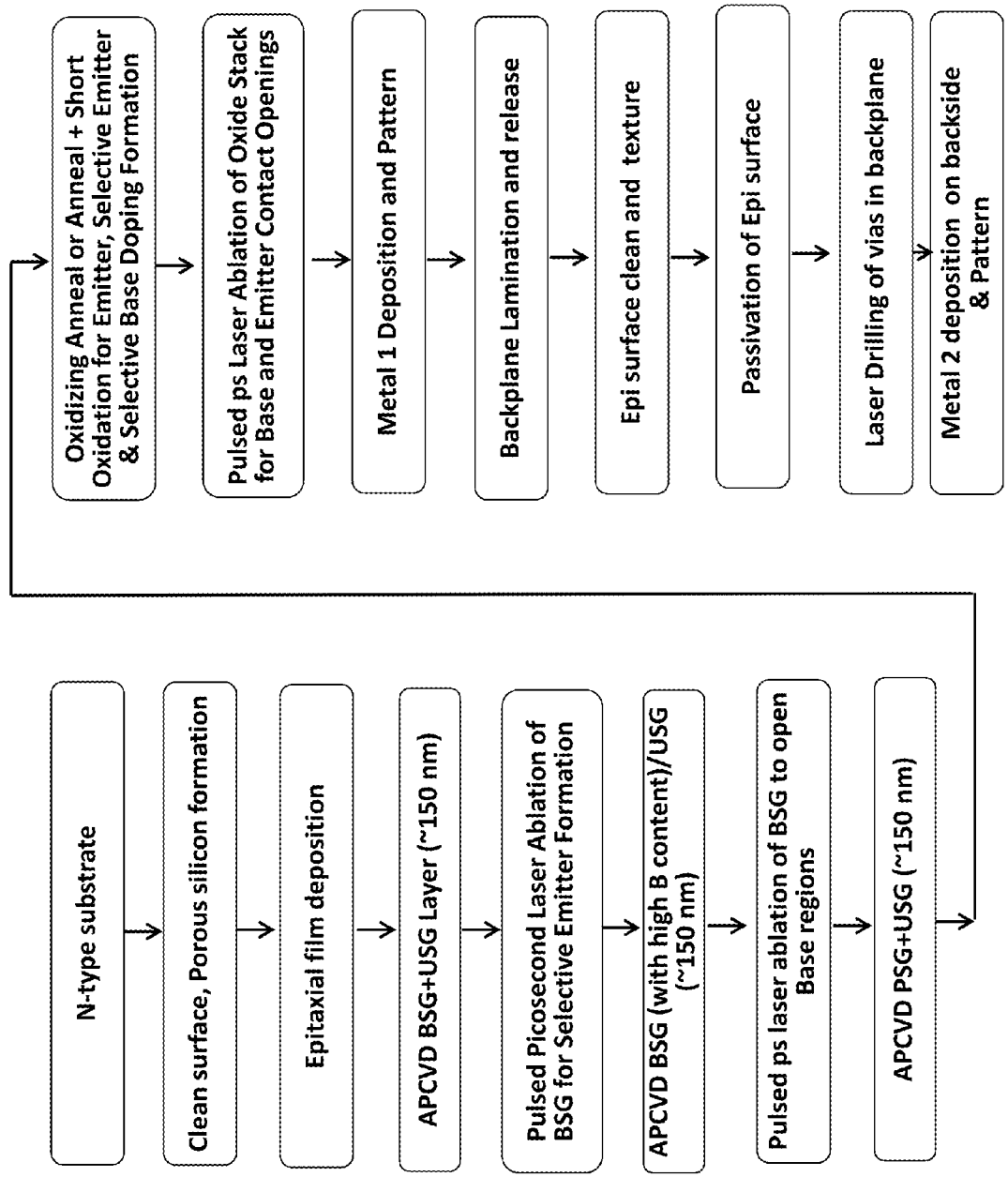
FIG. 2B is a representative manufacturing process flow for forming a back-contact/back-junction cell using epitaxial silicon lift-off processing.

FIG. 2B is a representative manufacturing process flow for forming a back-contact/back-junction cell using epitaxial silicon lift-off processing may comprise the following fabrication steps: 1) start with reusable template; 2) form porous silicon on template (for example bilayer porous Si using anodic etch); 3) deposit epitaxial silicon with in-situ doping; 4) perform back-contact/back-junction cell processing while on template including M1 formation; 5) laminate backplane sheet on back-contact cell, laser scribe release border around the backplane into epitaxial silicon layer, and cell release; 7) proceed with performing back-end processes including: wet silicon etch/texture/clean, PECVD sunnyside and trench edge passivation, laser drilling of via holes in backplane, PVD deposition or evaporation of metal (—Al), or plating (Cu) for M2, and final laser ablation to complete M2 patterning.

The described process flows of FIGS. 2A and 2B result in a solar cell formed on an epitaxially deposited thin silicon film with an exemplary thickness in the range of approximately 10 up to about 100 microns. Tables 1 and 2 below presents two process flow embodiments and corresponding processing steps for the formation of a thin crystalline (having a thickness in the range of approximately 5 to 100 um) back-contact back-junction solar cell with dual-level metallization.

TABLE 1

Thin mono-crystalline back-contact back-junction solar cell with dual level metallization process flow.

| | |
|---|---|
| 1. Porous Silicon | Anodic Etch |
| 2. Silicon Epitaxy | SUPREME |
| 3. BSG Deposition | APCVD |
| 4. BSG Opening | Laser |
| 5. PSG Deposition | APCVD |
| 6. Anneal/Back passiv. | Furnace |
| 7. Open Contact | Laser |
| 8. Al Paste Print, Dry | Screen Print |
| 9. Anneal | Laser |
| 10. Backplane, Release | Laminator, MR |
| 11. Texturization | Wet Etch |
| 12. Front Passivation | PECVD |
| 13. Backplane Holes | CO2 Laser |
| 14. Metallization | Thermal Spray |

TABLE 2

Thin mono-crystalline or quasi mono-crystalline back-contact back-junction solar cell with dual level metallization process flow.

| | |
|---|---|
| 1. BSG Deposition | APCVD |
| 2. BSG Opening | Laser |
| 3. PSG Deposition | APCVD |
| 4. Anneal/Back passiv. | Furnace |
| 5. Open Contact | Laser |
| 6. Al Paste Print, Dry | Screen Print |
| 7. Anneal | Laser |
| 8. Backplane | Laminator |
| 9. Si Cut | Laser |
| 10. Texturization | Wet Etch |
| 11. Front Passivation | PECVD |
| 12. Backplane Holes | CO2 Laser |
| 13. Metallization | PVD |
| 14. Metal pattern | Laser |

Figure 3:
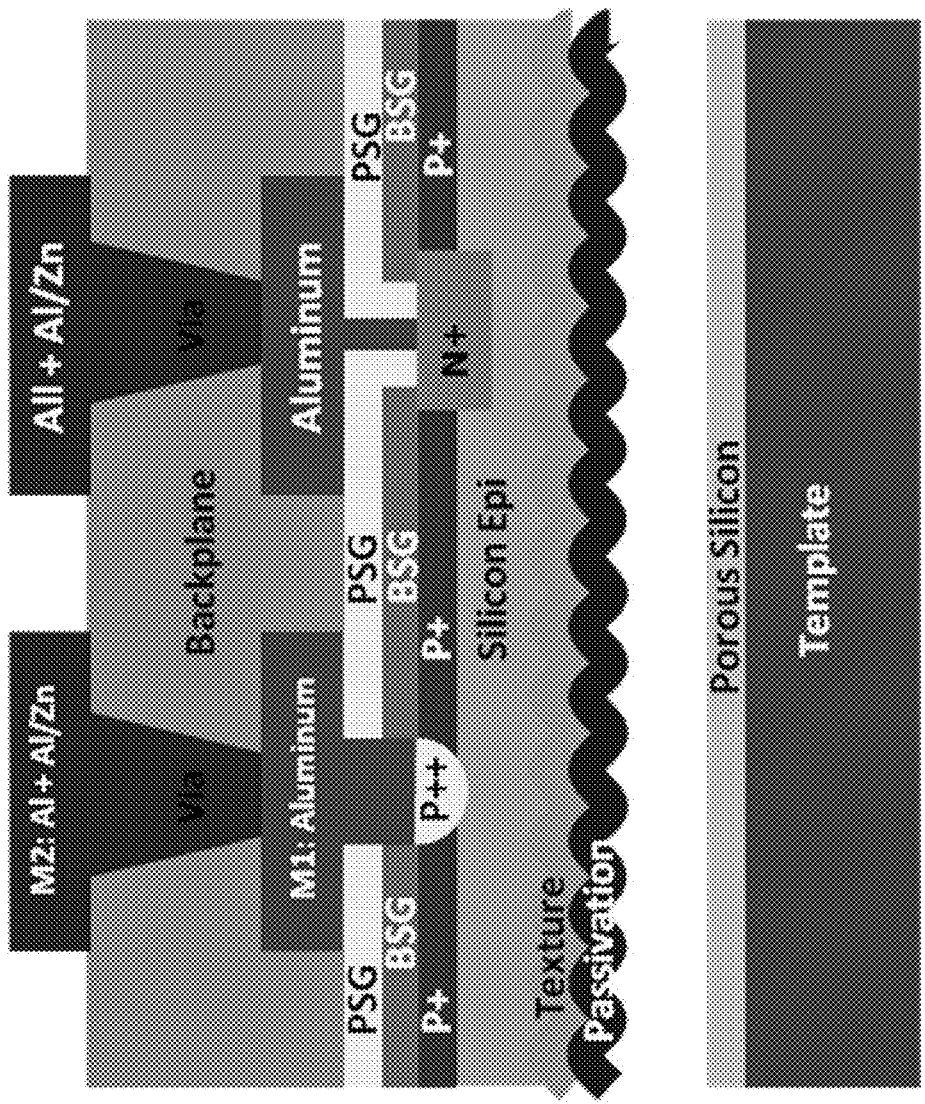
FIG. 3 is a cross-sectional diagram of a thin crystalline solar cell.

FIG. 3 is a cross-sectional diagram of a thin crystalline solar cell embodiment formed according to the process flow detailed in Table 1. Note that the porous silicon and mother template structures from which the solar cells have been separated are also shown—the template may be processed (cleaned) for further reuse cycles to amortize fabrication costs. Note that the two level metallization layers M1 and M2 may run parallel or perpendicular to each other. In other words, in the interdigitated fingers of M1 and M2 may be designed in a parallel pattern or an orthogonal pattern. Additionally, the disclosed test structures and methods are also applicable to alternative dual level metallization schemes and process flows. Further, specific metals and metal stacks are shown as an example and are not intended to limit the scope of the metallization material choices.

Contacts to the diffusion layers (emitter or base) are designed to extract diffusion and metal-semiconductor contact resistances for both emitter and base. The design of metal layer 1, metal layer 2 and via contacts between metal layer 1 and 2 are designed to extract the metal line resistances and contact resistances. Importantly, the process flow and the materials used (metal layers, di-electric layer) for the test structure wafers can be the same as used in the product wafer as a slight modification in metallization pattern comprises the difference between a test cell and a solar cell product. Thus, the test structures disclose herein may be used to measure resistance in test structure cells or may be completely integrated as product cells.

Figure 4:
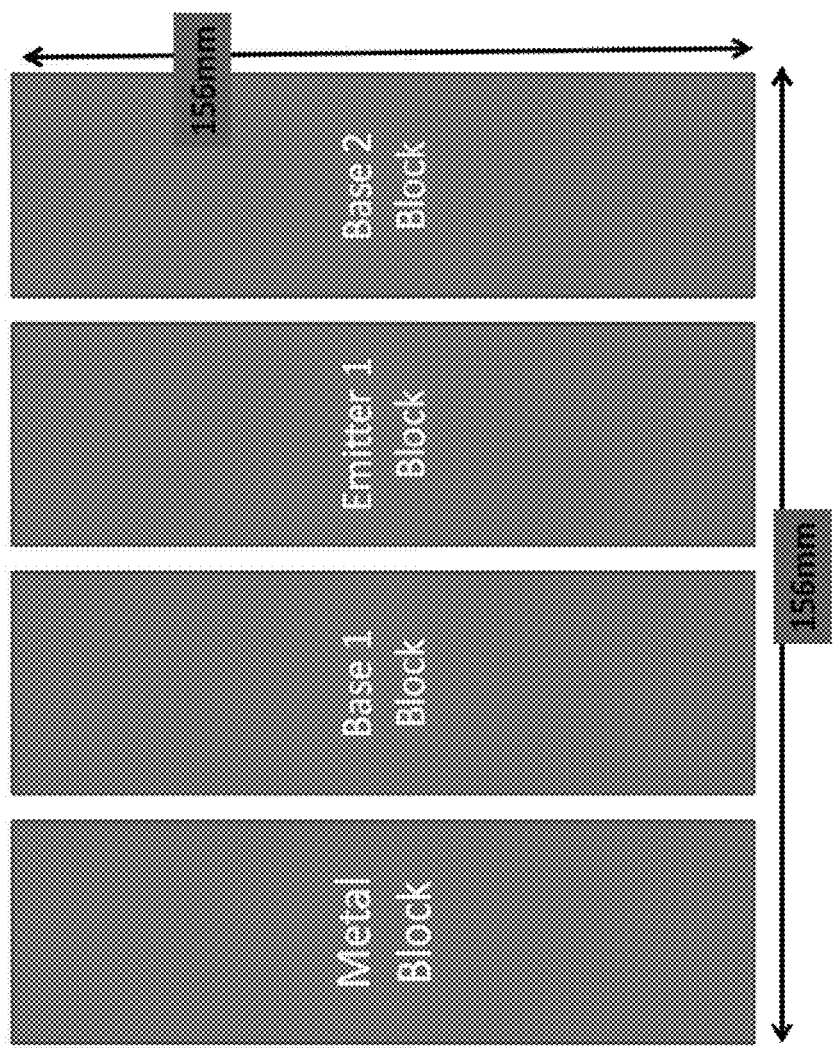
FIG. 4 is a top view of a resistance test structure showing a block design layout.

In some instances, in a resistance test structure cell, the cell may be divided into at least 3 different blocks. In some instances, the test structure may be a specially patterned M2 layer or may be an alternative structure contacted to the M2 layer depending on the electrical parametric value to be tested and desired test structure integration. FIG. 4 is a top view of a resistance test structure showing a block design layout embodiment on a solar cell in accordance with the disclosed subject matter. Metal block is used to extract the resistances of M2, M1-M2 contacts, and M1 (there are no contacts from M1 to the on-silicon emitter or base diffusion regions). Base block is used to extract base bulk diffusion resistance and M1 to base contact resistance. Emitter block is used to extract emitter diffusion resistance and M1 to emitter contact resistance. The example of FIG. 4 has two base block instances to capture and measure spatial variation data for the base resistance. Similarly emitter and metal blocks may be repeated in a different design to obtain the spatial resistance information of these components. And while the design of FIG. 4 is for a 156 mm×156 mm cell, the test structure may be designed for any cell size, and in some instances may occupy a small space alongside a solar cell (in other words, the test structure is physically attached but not necessarily electrically connected). Further, different sizes of this test structures may be obtained by changing the number of repeated extractions needed per cell. In FIG. 4, the blocks are about ¼ th the size of the cell itself. However, the blocks may be as big as the solar cell or as small as approximately one-half of M2 pitch in width and few M1 pitches in length for the metal block, and as small as approximately a few M2 pitches in width and few M1 pitches in length for the base and emitter blocks.

FIG. 5A is a diagram of a top view of a M1 and M2 test structure layout. As shown, M2 lines corresponding to the Metal Block component and the metal block component does not contact the on-silicon emitter or base diffusion regions— in other words there are no contacts from M1 to the on-silicon emitter or base diffusion regions where the Metal Block component is attached. In this block M2 lines are pads on top of M1 lines. FIG. 5B is a cross-sectional diagram of the solar cell structure drawn in the direction of the black arrow in FIG. 5A. Thus, the cross section only shows emitter M1 line; however, the same may be repeated for M1 base line. The underlying structure of the solar cell is the same, with the only exception being that contact open step between M1 to silicon was skipped only in this block and the M2 line was modified to be a pad instead of a full line.

Figure 6B:
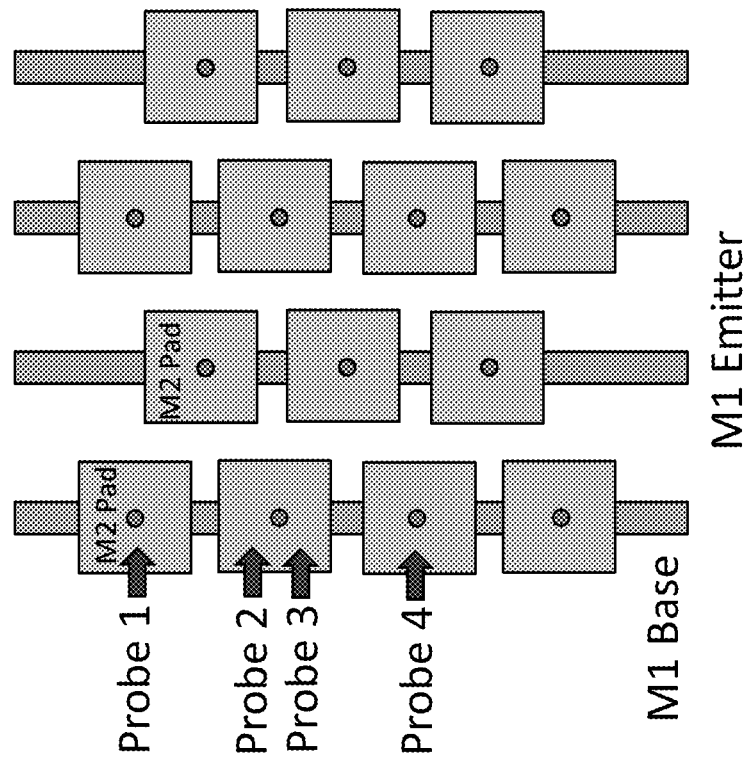
FIGS. 6A and 6B are top view diagrams of M1-M2 contact and M1 resistance test structures.
Figure 6A:
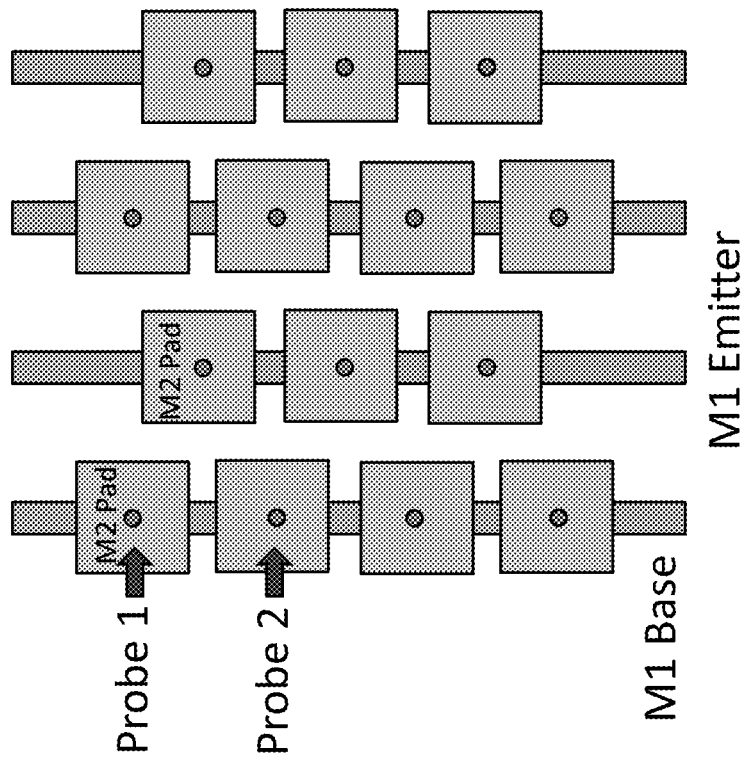
Figure 7:
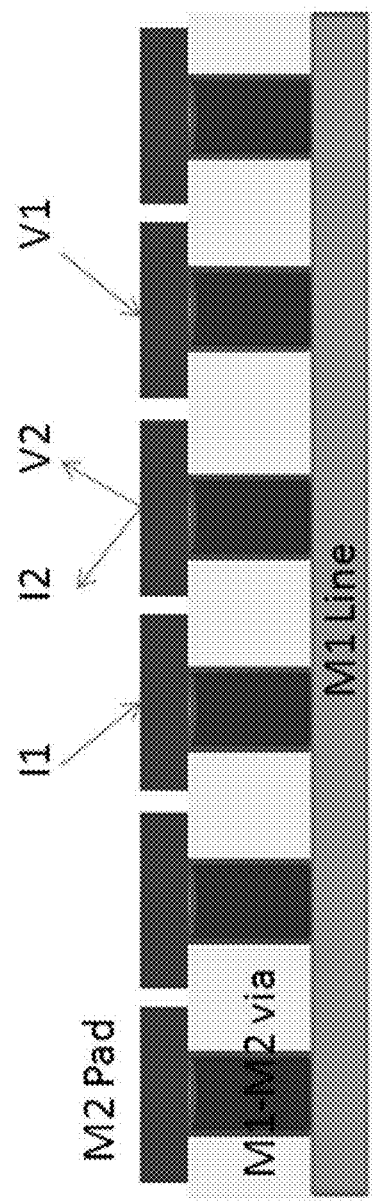
FIG. 7 is a cross-sectional diagram of a test structure.

FIGS. 6A and 6B are top view diagrams of M1-M2 contact and M1 resistance test structures having alternative probing configurations. M2 pads connect to M1 lines through M1-M2 vias. The number of vias per pad may be varied. By measuring the resistance on various pairs of pads, M1 and M1-M2 contact resistance may be extracted by using extraction techniques such as transfer length method (TLM) and by direct measurement of via resistance (shown in FIG. 7). FIG. 7 is a cross-sectional diagram of a test structure in metal block along one M1 line. Direct measurement of via resistance is determined using current source connections I1 and I2 and voltage probe connections V1 and V2.

Figures 8A, 8B:
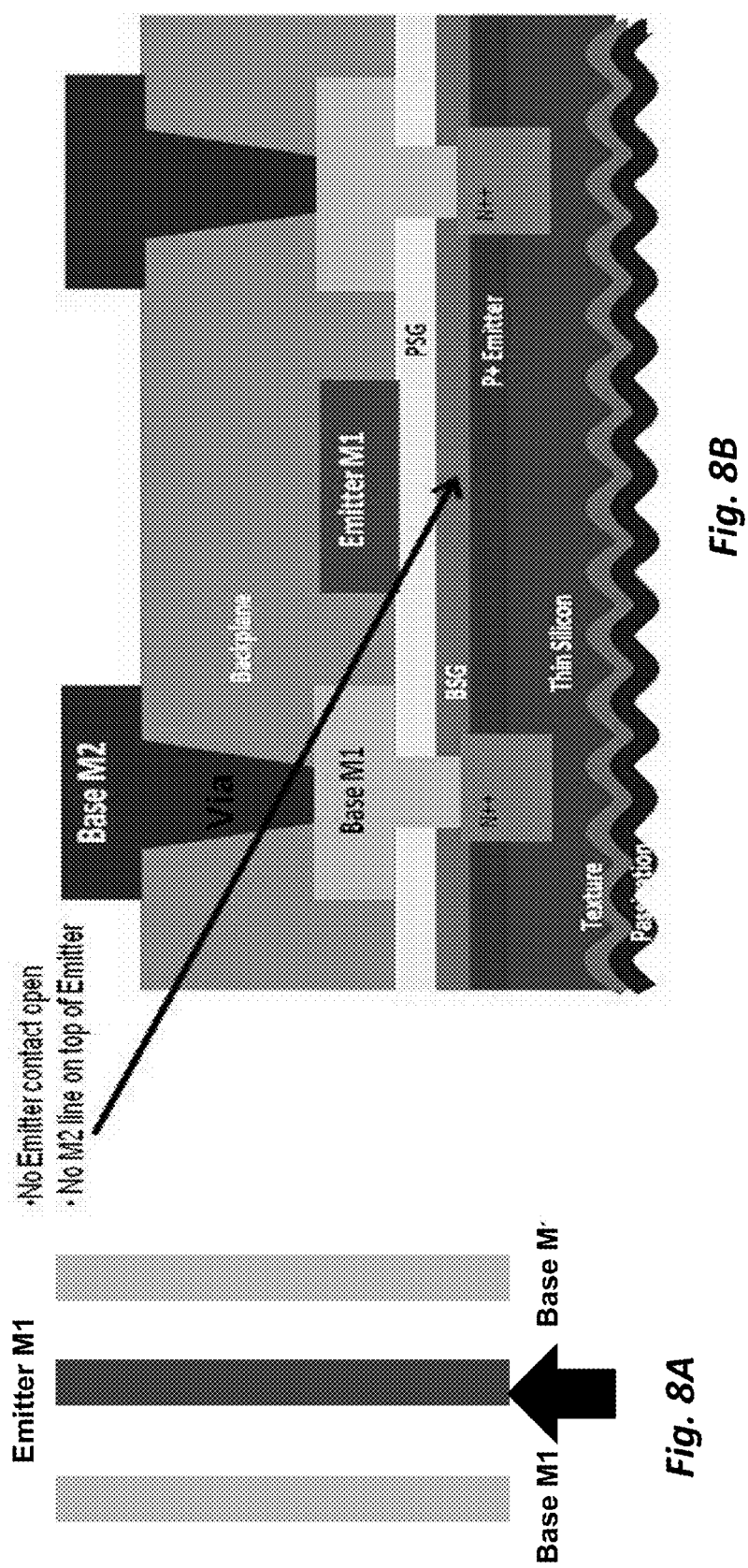
FIG. 8A is a diagram of a top view of a M1 emitter and base lines.
FIG. 8B is a cross-sectional diagram of the solar cell structure of FIG. 8A.

For a base block, there are no contacts M1 to emitter contacts. M2 pads and M1-M2 vias may be laid out such that the current flows through the base only (as shown in FIGS. 8A and 8B). For example, the M2 pads (or full lines) measuring the total resistance are laid out such that they connect adjacent M1 Base lines. Alternatively, if the M2 pads are instead lines, M2 lines run parallel to M1 lines and are connected through numerous vias so that M1 to M2 resistance is not limiting. Further, M1 to M2 resistances may be extracted out by the metal block part of the structure as described above. Thus, the total measured resistance through this design layout encompasses, M1-M2 Via, M1 to Base diffusion contact resistance, and base diffusion resistances. The base diffusion resistance and M1 to base diffusion contact resistance may then be distinguished by using any of the aforementioned techniques including TLM. If there is a front surface field (FSF), this test structure may also measure the diffusion resistance of the front surface field in parallel with the base resistance. The design may be adopted for single layer metallization conventional back contacted cells as well by measuring the resistances across different base metal lines.

FIG. 8A is a diagram of a top view of a M1 emitter and base lines. Note, M2 lines run on top of M1 and are separated by the Backplane (of the dielectric), but are omitted in the top view diagram for simplicity. FIG. 8B is a cross-sectional diagram of the solar cell structure drawn in the direction of the black arrow in FIG. 8A and showing the base block. The emitter contact open is skipped in this part of the cell and the current flows from Base M2 to Base M1 to Thin Silicon base and back up to the adjacent base M2.

Figure 9A:
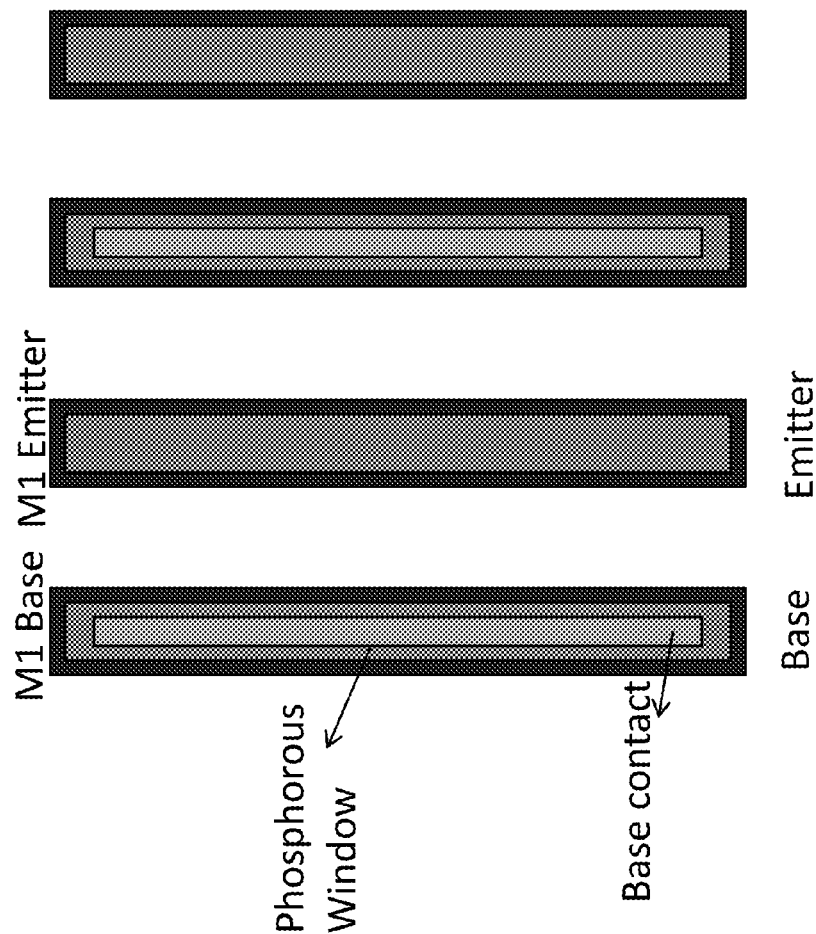
FIGS. 9A and 9B are top view diagrams of a base sheet resistance and M1-Base contact test structure.
Figure 9B:
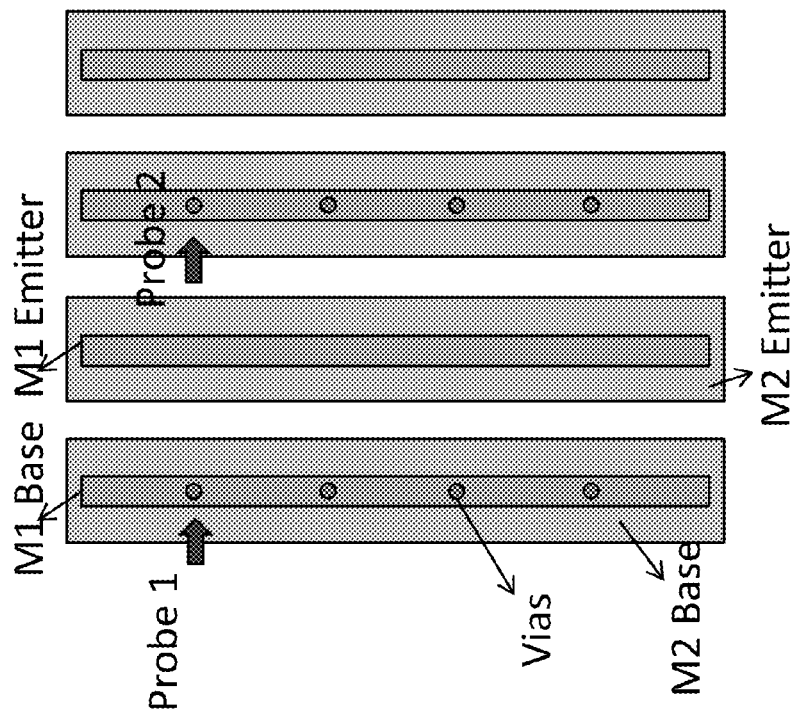

FIGS. 9A and 9B are top view diagrams of a base sheet resistance and M1-Base contact test structure. FIG. 9A is an M1 layer and FIG. 9B is an M2 layer positioned on the M1 layer. The M1 and M2 layers are connected by vias.

Figures 10A, 10B:
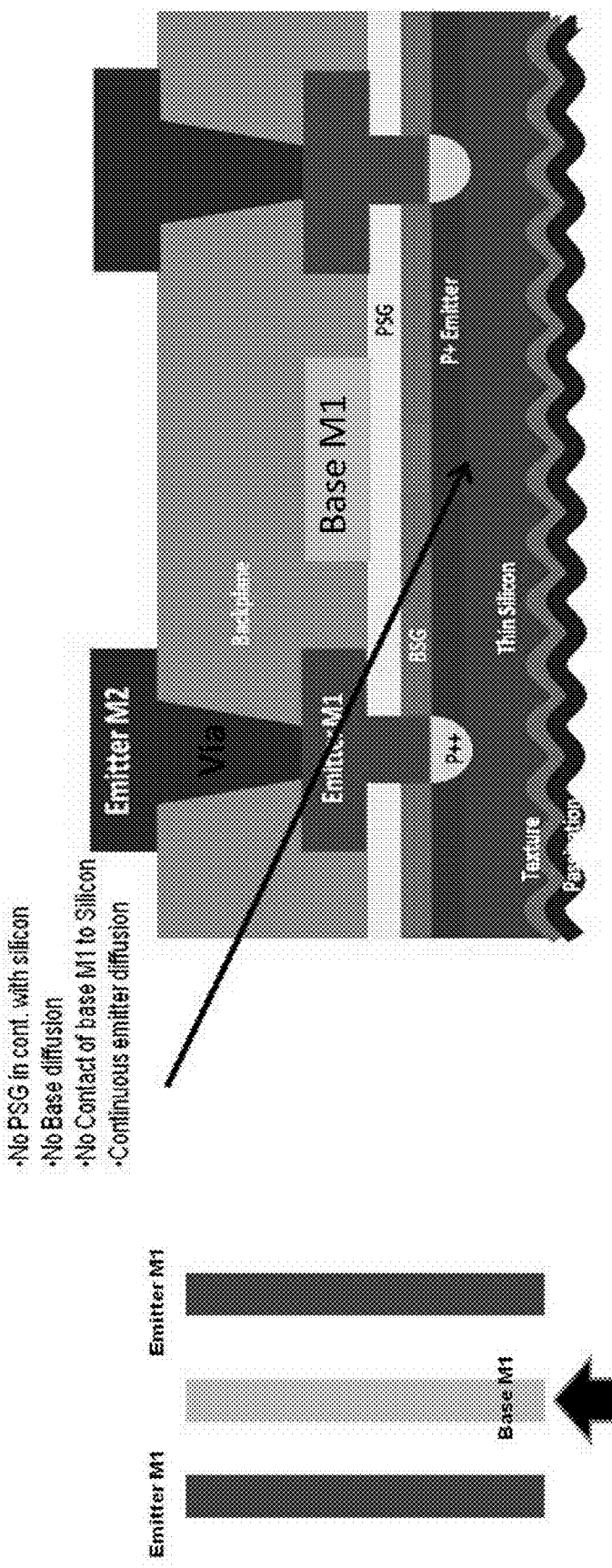
FIG. 10A is a diagram of a top view of a M1 emitter and base lines.
FIG. 10B is a cross-sectional diagram of the solar cell structure of FIG. 10A.

For an emitter block, there are no M1 to base contacts. Similar to the base block, these structures may be used to extract emitter sheet resistance and emitter to M1 contact resistance (as shown in FIGS. 10A and 10B). The extraction is analogous to the base block extraction with an exception: for the base block (M1 to base diffusion contact and base diffusion and FSF) skipping the contact from Metal 1 to emitter diffusion was not necessary but optional (and the case depicted in FIGS. 8A and 8B), for the emitter diffusion resistance extraction it is required to skip the base diffusion doping (for base contact) which interrupts the emitter diffusion resistance. In some instances, if not skipped there will not be an uninterrupted emitter diffusion connection between emitter M1 lines. One processing solution for this result is to skip the Boron doped glass layer (BSG) opening step (step #4 in Table 1) in areas under the Emitter block. This allows the phosphorous doped glass (PSG) layer to not be deposited in contact with silicon but rather on top of the BSG layer in only these selected areas under the emitter block. Thus, no phosphorous is diffused in these areas during the dopant drive in step (step #6 in Table 2) ensuring a continuous and uninterrupted emitter diffusion to the next emitter contact line. This scheme may also be used with a single level metal back contacted design.

FIG. 10A is a diagram of a top view of a M1 emitter and base lines. Note, M2 lines run on top of M1 separated by the Backplane (of the dielectric), but are omitted in the top view diagram for simplicity. FIG. 10B is a cross-sectional diagram of the solar cell structure drawn in the direction of the black arrow in FIG. 10A and showing the emitter block. As shown in FIG. 10B, an uninterrupted current flow path occurs from Emitter to emitter through emitter diffusion resistance in silicon. This allows extraction of Emitter to silicon contact as well as the diffusion resistance of emitter. There is no base contact or base diffusion under the base Metal 1 line, which may be achieved by designing a pattern which allows a skipping of this formation step only in this spatial area of the cell.

Figure 11A:
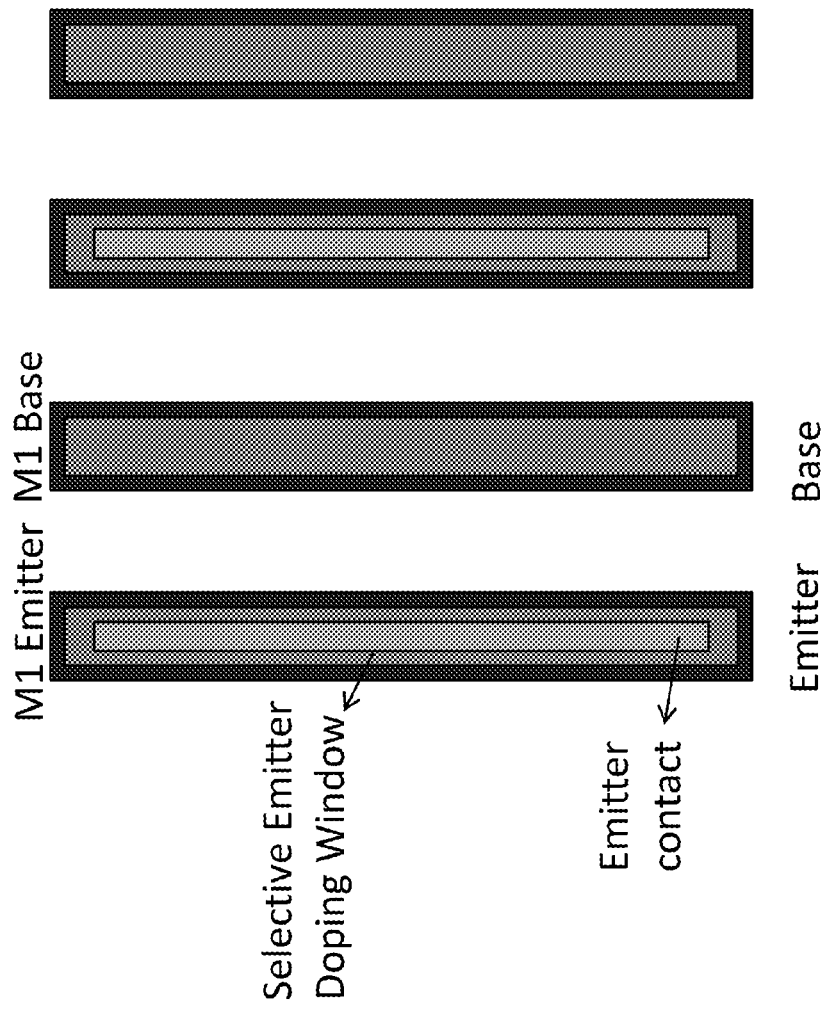
FIGS. 11A and 11B are top view diagrams of emitter sheet resistance and M1-Emitter contact test structures.
Figure 11B:
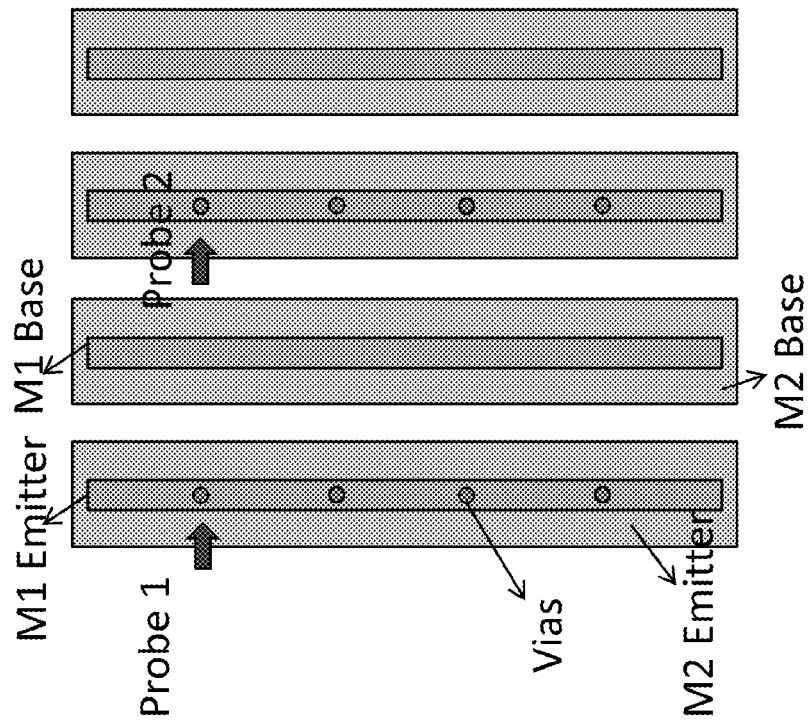

FIGS. 11A and 11B are top view diagrams of emitter sheet resistance and M1-Emitter contact test structures. FIG. 11A is an M1 layer and FIG. 11B is an M2 layer positioned on the M1 layer. The M1 and M2 layers are connected by vias.

Figure 12:
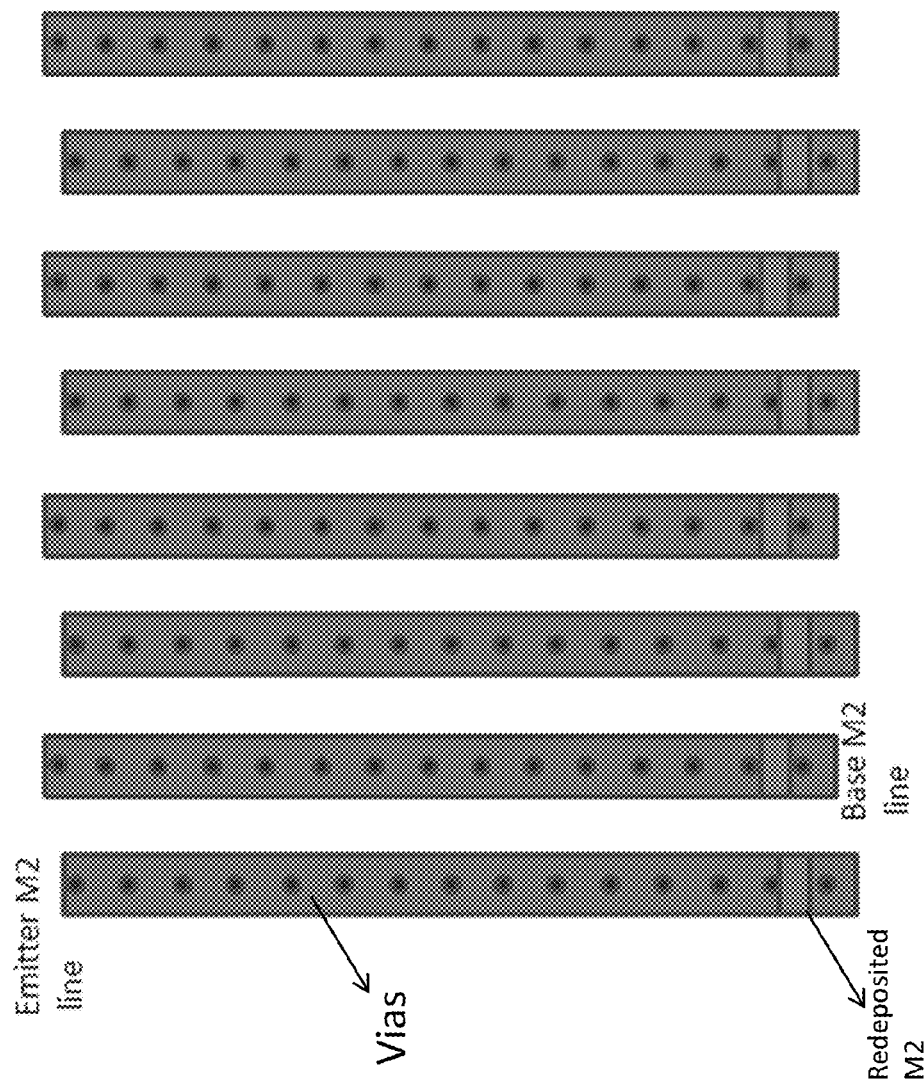
FIG. 12 is a top view of M2 metal line pattern with test pads after redeposition of M2.

Further, the test structures disclosed herein may be incorporated into product cells by patterning individual M2 pads. In these cases, the M2 layer is patterned to extract desired electrical parametric values, then after testing the M2 pattern is completed as an electrically conductive M2 pattern as described above. These structures may be used to extract the components of series resistance and capture data to be used for process control in the production line. Once the resistance values are extracted, the M2 may be redeposited (as shown in FIG. 12) to connect these pads to the M2 lines. FIG. 12 is a top view of M2 metal line pattern with test pads after redeposition of M2—in other words, the M2 metal pattern with the individual pads and redeposited metal on the M2 lines to connect these pads to the M2 lines after the testing is done.

The foregoing description of the exemplary embodiments is provided to enable any person skilled in the art to make or use the claimed subject matter. Various modifications to these embodiments will be readily apparent to those skilled in the art, and the generic principles defined herein may be applied to other embodiments without the use of the innovative faculty. Thus, the claimed subject matter is not intended to be limited to the embodiments shown herein but is to be accorded the widest scope consistent with the principles and novel features disclosed herein. Further, it is intended that all such additional systems, methods, features, and advantages that are included within this description be within the scope of the claims.

What is claimed is:

1. A back contact crystalline semiconductor solar cell test structure, comprising:
   a first electrically conductive metallization layer having an interdigitated pattern of emitter electrodes and base electrodes on a backside surface of a crystalline solar cell substrate;
   an electrically insulating layer attached to said backside surface of said crystalline substrate, said electrically insulating layer electrically isolating said first metallization layer from a second electrically conductive metallization layer;
   a second electrically conductive metallization layer providing high-conductivity cell interconnections to said first electrically conductive interconnect layer through conductive via holes formed in said electrically insulating layer, said second electrically conductive interconnect layer having an interdigitated pattern of emitter electrodes and base electrodes; and
   an electrically conductive resistance test structure contacted to said second electrically conductive metallization layer and extracting at least one electrical parametric value component of said solar cell structure.

2. The back contact crystalline semiconductor solar cell test structure of claim 1, wherein said electrically conductive resistance test structure comprises a metal block test component contacted to said second electrically conductive metallization layer, said electrically conductive resistance test structure not contacted to said first electrically conductive metallization layer.

3. The back contact crystalline semiconductor solar cell test structure of claim 1, wherein said electrically conductive resistance test structure comprises a base block test component contacted to said base electrodes of said first electrically conductive metallization layer.

4. The back contact crystalline semiconductor solar cell test structure of claim 1, wherein said electrically conductive resistance test structure comprises an emitter block test component contacted to said emitter electrodes of said first electrically conductive metallization layer.

5. The back contact crystalline semiconductor solar cell test structure of claim 1, said electrically conductive resistance test structure further comprising:
   a metal block test component contacted to said second electrically conductive metallization layer, said electrically conductive resistance test structure not contacted to said first electrically conductive metallization layer;
   a base block test component contacted to said base electrodes of said first electrically conductive metallization layer; and
   an emitter block test component contacted to said emitter electrodes of said first electrically conductive metallization layer.

6. A method for measuring an electrical parametric value from a back contact crystalline semiconductor solar cell, comprising:
   forming a first layer of electrically conductive metal having an interdigitated pattern of base electrodes and emitter electrodes on the backside surface of a crystalline semiconductor solar cell substrate;
   forming an electrically insulating layer on said first layer of electrically conductive metal, said dielectric layer providing electrical isolation between said first layer of electrically conductive metal and a second layer of electrically conductive metal;
   forming vias in said electrically insulating layer, said vias providing access to said first layer of electrically conductive metal;
   forming a second electrically conductive metallization layer on said electrically insulating layer, said second electrically conductive metallization layer contacting said first electrically conductive metal layer through said vias; and
   extracting an electrical parametric value from said back contact crystalline semiconductor solar cell by probing said second electrically conductive metallization layer with an electrical current or voltage.

7. The method for measuring an electrical parametric value from a back contact crystalline semiconductor solar cell of claim 6, wherein said electrical parametric value is the resistance of said second electrically conductive metallization layer, said vias, and said first electrically conductive metallization layer.

8. The method for measuring an electrical parametric value from a back contact crystalline semiconductor solar cell of claim 6, wherein said electrical parametric value is the base diffusion resistance of said crystalline semiconductor solar cell substrate.

9. The method for measuring an electrical parametric value from a back contact crystalline semiconductor solar cell of claim 6, wherein said electrical parametric value is the emitter diffusion resistance of said crystalline semiconductor solar cell substrate.

10. The method for measuring an electrical parametric value from a back contact crystalline semiconductor solar cell of claim 6, further comprising:
- measuring the resistance of said second electrically conductive metallization layer, said vias, and said first electrically conductive metallization layer;
- measuring the base diffusion resistance of said crystalline semiconductor solar cell substrate; and
- measuring the emitter diffusion resistance of said crystalline semiconductor solar cell substrate.

11. A method for measuring an electrical parametric value from a back contact crystalline semiconductor solar cell, comprising:
- forming a first layer of electrically conductive metal having an interdigitated pattern of base electrodes and emitter electrodes on the backside surface of a crystalline semiconductor solar cell substrate;
- forming an electrically insulating layer on said first layer of electrically conductive metal, said dielectric layer providing electrical isolation between said first layer of electrically conductive metal and a second layer of electrically conductive metal;
- forming vias in said electrically insulating layer, said vias providing access to said first layer of electrically conductive metal;
- forming a second electrically conductive metallization layer on said electrically insulating layer, said second electrically conductive metallization layer contacting said first electrically conductive metal layer through said vias, said second electrically conductive metallization layer having a pattern comprising an emitter block contacting said emitter electrodes and an base block contacting said base electrodes;
- measuring the base diffusion resistance of said crystalline semiconductor solar cell substrate by probing said base block with electrical voltage or current;
- measuring the emitter diffusion resistance of said crystalline semiconductor solar cell substrate by probing said emitter block with electrical voltage or current;
- forming said second electrically conductive metallization layer as an interdigitated pattern of base conductor fingers and emitter conductor fingers.

12. The method for measuring an electrical parametric value from a back contact crystalline semiconductor solar cell of claim 11, wherein said interdigitated pattern of base conductor fingers and emitter conductor fingers are patterned parallel to said interdigitated pattern of base electrodes and emitter electrodes.

13. The method for measuring an electrical parametric value from a back contact crystalline semiconductor solar cell of claim 11, wherein said interdigitated pattern of base conductor fingers and emitter conductor fingers are patterned perpendicular to said interdigitated pattern of base electrodes and emitter electrodes.

* * * * *